(12) United States Patent
Odake

(10) Patent No.: US 7,129,135 B2
(45) Date of Patent: Oct. 31, 2006

(54) NONVOLATILE SEMICONDUCTOR MEMORY DEVICE AND METHOD FOR FABRICATING THE SAME

(75) Inventor: Yoshinori Odake, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/195,652

(22) Filed: Aug. 3, 2005

(65) Prior Publication Data
US 2006/0039175 A1    Feb. 23, 2006

(30) Foreign Application Priority Data
Aug. 18, 2004    (JP)    ............................. 2004-238036

(51) Int. Cl.
*H01L 21/336* (2006.01)
(52) U.S. Cl. ............... 438/258; 438/241; 438/E21.659; 438/266; 438/E21.66; 257/316; 257/E21.662; 257/E21.21
(58) Field of Classification Search ............... 438/241, 438/257, 258, 266, 706, 745; 257/316
See application file for complete search history.

(56) References Cited

U.S. PATENT DOCUMENTS 5,330,924 A * 7/1994 Huang et al. ............... 438/258

FOREIGN PATENT DOCUMENTS

| JP | 11-54730 A | 2/1999 |
|---|---|---|
| JP | 2003-17596 A | 1/2003 |

* cited by examiner

*Primary Examiner*—Quoc Hoang
(74) *Attorney, Agent, or Firm*—McDermott Will & Emery LLP

(57) ABSTRACT

A first conductive film for forming a plurality of word lines is formed in a memory cell array formation region of a semiconductor substrate for a nonvolatile semiconductor memory device, and a second conductive film is formed in a semiconductor device formation region of the semiconductor substrate. Next, openings are formed in the first conductive film by a first dry etching process such that the word lines in the memory cell array formation region are located apart from one another. Thereafter, sidewall insulating films for the word lines are formed in the openings. Next, parts of the sidewall insulating films located adjacent to the ends of the word lines are removed by wet etching. Next, a part of the first conductive film located around a word line formation region is removed by a second dry etching process. The openings are formed in the first conductive film such that a part of the first conductive film remaining after the formation of the openings is continuous with the second conductive film, which is formed on an active region of the semiconductor substrate located outside the memory cell array formation region so as to be electrically connected to the active region.

14 Claims, 22 Drawing Sheets

(PRIOR ART)

(PRIOR ART)

(PRIOR ART)

(PRIOR ART)

NONVOLATILE SEMICONDUCTOR MEMORY DEVICE AND METHOD FOR FABRICATING THE SAME

CROSS-REFERENCE TO RELATED APPLICATIONS

The disclosure of Japanese Patent Application No. 2004-238036 filed on Aug. 18, 2004 including specification, drawing and claims is incorporated herein by reference in its entirety.

BACKGROUND OF THE INVENTION (1) Field of the Invention

The present invention relates to a nonvolatile semiconductor memory device and a method for fabricating the same, and more particularly relates to a nonvolatile semiconductor memory device for avoiding or suppressing damage caused by charging during processing and a method for fabricating the same.

(2) Description of Related Art

In recent years, as the memory cell size is reduced with an increase in the integration level of nonvolatile semiconductor memory devices, thinner gate electrodes serving as word lines have been suggested. However, the thinner gate electrodes make high-speed operations difficult. The reason for this is that narrower word lines increase the word-line resistances, leading to the increased delay of word-line signals.

To cope with this, it should be considered to use a self-align silicide technology (hereinafter, referred to "salicide technology") as a measure for reducing the word-line resistances. When the salicide technology is applied to nonvolatile semiconductor memory devices, the sidewall of a gate electrode for each of memory cells need previously be covered with an insulating film to prevent shorting between a word line and a source diffusion layer or a drain diffusion layer and between a semiconductor substrate and a source diffusion layer or a drain diffusion layer.

For a memory cell of a nonvolatile semiconductor memory device, a relatively thick insulating film need usually be formed on the sidewall of a gate electrode to cope with characteristic variations and damage due to ion implantation for the formation of a source diffusion layer or a drain diffusion layer. Furthermore, in order to avoid exposing regions of a semiconductor substrate between word lines, spaces between all adjacent pairs of word lines need be completely filled with an insulating film with which the sidewall of the gate electrode is covered in accordance with the structure of a memory cell array.

Meanwhile, a nonvolatile semiconductor memory device is provided with a semiconductor device formed at a region of a semiconductor substrate outside a memory cell array region thereof. Since high performance is demanded for such a semiconductor device, it is desirable that a relatively thin insulating film is formed on the sidewall of the semiconductor device. In view of the above, it has been suggested that only the sidewall of a gate electrode serving as a word line in the memory cell array region is to be covered with a particularly thick insulating film.

As an example of a method in which the sidewall of a gate electrode serving as a word line in a memory cell array region is covered with a thick insulating film, a method for fabricating a nonvolatile semiconductor memory device according to a first known example will be described hereinafter with reference to FIGS. 16A through 18C and 19 (see, for example, Patent Document 1 (Japanese Unexamined Patent Publication No. 2003-17596)).

FIGS. 16A through 18C and 19 are cross-sectional views showing process steps in a method for fabricating the principal part of a nonvolatile semiconductor memory device according to the first known example. The method for fabricating a nonvolatile semiconductor memory device will be described hereinafter with reference to a stacked nonvolatile semiconductor memory device having a floating gate as an example of nonvolatile semiconductor memory devices. In FIGS. 16A through 18C and 19, a substrate region in which a memory cell array of a nonvolatile memory is formed is designated as a first area 100A, and a substrate region in which a semiconductor device is formed is designated as a second area 100B.

First, as shown in FIG. 16A, a p-type well region 101 is formed in the top surface of a p-type silicon substrate 100, and an isolation insulating film 102 is formed in the p-type well region 101. Thereafter, a tunnel oxide film 103 is formed on the p-type well region 101 and the isolation insulator film 102 located in both the first and second areas 100A and 100B. Next, a first polysilicon film 104 is selectively formed on the tunnel oxide film 103, and then a capacitive insulating film 105 is formed to cover the first polysilicon film 104.

Next, as shown in FIG. 16B, a first resist pattern 106 is formed to cover a part of the capacitive insulating film 105 located in the first area 100A, and etching is performed using the first resist pattern 106 as a mask. In this way, respective parts of the capacitive insulating film 105, the first polysilicon film 104 and the tunnel oxide film 103 located in the second area 100B are removed.

Next, as shown in FIG. 16C, a gate oxide film 107 is formed in the top surface of a part of the p-type well region 101 located in the second area 100B by thermally oxidizing the p-type silicon substrate 100. Thereafter, a second polysilicon film 108 is formed to entirely cover the first and second areas 100A and 100B. Although in the drawings the capacitive insulating film 105 in the first area 100A is not shown in detail, it typically has a three-layer structure (an ONO film) composed of an oxide film, a $Si_3N_4$ film, and an oxide film. In addition, although not shown for simplicity, an oxide film is formed also in the uppermost surface of the capacitive insulating film 105 in the first area 100A by thermal oxidation for the formation of the gate oxide film 107 in the second area 100B.

Next, as shown in FIG. 17A, a second resist pattern 109 is formed to cover a region of the first area 100A in which a stacked gate electrode of a nonvolatile memory is to be formed and the second area 100B, and the second polysilicon film 108, the capacitive insulating film 105, the first polysilicon film 104, and the tunnel oxide film 103 are successively etched using the second resist pattern 109 as a mask. In this way, a stacked gate electrode 108c is formed which is composed of a tunnel oxide film 103a, a floating gate electrode 104a, a capacitive insulating film 105a, and a control gate electrode 108a. In the second area 100B, the second polysilicon film 108 is patterned into a second polysilicon film 108a by etching.

Next, as shown in FIG. 17B, a third resist pattern 110 is formed to expose parts of the substrate region that will be source/drain regions of the nonvolatile memory, and n-type impurity ions are implanted (111) into the p-type well region 101 using the third resist pattern 110 and the stacked gate electrode 108c as masks. In this way, lightly-doped impurity regions 112 are formed which will become source/drain regions of the nonvolatile memory.

Next, as shown in FIG. 17C, an oxide film 113 that will partly become a sidewall insulating film of the stacked gate electrode 108c is deposited by chemical vapor deposition (CVD) to entirely cover the first and second areas 100A and 100B. Although the oxide film 113 has a thickness of, for example, about 200 nm, the thickness can be adjusted so that the sidewall insulating film formed on the sidewall of the stacked gate electrode 108c has a desired thickness.

Next, as shown in FIG. 18A, the oxide film 113 is subjected to anisotropic etching. In this way, the top surface of the stacked gate electrode 108c in the first area 100A and the top surface of the second polysilicon film 108a in the second area 100B are exposed, and first sidewall insulating films 113a are formed on the sidewall of the stacked gate electrode 108c in the first area 100A and the sidewall of the second polysilicon film 108a in the second area 100B, respectively. The above-described anisotropic etching is preferably carried out with such an etching selectivity that even if the respective top surfaces of the stacked gate electrode 108c and the second polysilicon film 108a have been exposed, the stacked gate electrode 108c and the second polysilicon film 108a are hardly etched.

Although not shown, the oxide film 113 may be subjected to anisotropic etching such that spaces between all adjacent pairs of stacked gate electrodes 108c are completely filled with first sidewall insulating films 113a formed on the sidewalls of the stacked gate electrodes 108c in accordance with the structure of a memory cell array. Furthermore, the thicknesses of the first sidewall insulating films 113a formed on the sidewalls of the stacked gate electrodes 108c can be controlled by adjusting the thickness of the oxide film 113 deposited by CVD in the process step shown in FIG. 17C.

Next, as shown in FIG. 18B, a fourth resist pattern 114 is formed to cover the first area 100A and a region of the second area 100B in which a gate electrode of a semiconductor device is to be formed, and the patterned second polysilicon film 108a and the gate oxide film 107 are etched using the fourth resist pattern 114 as a mask. In this way, a gate electrode 108b and a gate oxide film 107b for the semiconductor device are formed in the second area 100B.

Next, as shown in FIG. 18C, a fifth resist pattern 115 is formed to cover the first area 100A, and ions are implanted (116) into the second area 100B, thereby forming lightly-doped impurity regions 117 that will become a source or drain for the semiconductor device in the second area 100B.

Next, as shown in FIG. 19, an oxide film is deposited all over the first and second areas 100A and 100B by CVD and then subjected to anisotropic etching. In this way, second sidewall insulating films 118 are formed on the sidewalls of the first sidewall insulating films 113a and the sidewall of the combination of the gate electrode 108b and the gate oxide film 107b for the semiconductor device in the second area 100B. As seen from the above, a double-layer structure of the first and second sidewall insulating films 113a and 118 is formed on the sidewall of the stacked gate electrode 108c in the first area 100A. Thereafter, ions of n-type impurities are implanted (119) into the p-type well region 101 using the stacked gate electrode 108c, the gate electrode 108b, and the second sidewall insulating films 118 as masks. In this way, heavily-doped impurity regions 120a that will become a source and a drain for the nonvolatile memory are formed in the first area 100A, and heavily-doped impurity regions 120b that will become a source and a drain for the semiconductor device are formed in the second area 100B. Next, a silicide layer 121 is selectively formed on the respective top surfaces of the stacked gate electrode 108c, the gate electrode 108b and the heavily-doped impurity regions 120a and 120b using a salicide technology. Although not shown, an interlayer insulating film, contact holes and an aluminum interconnect will be formed later.

As described above, according to the method for fabricating a nonvolatile semiconductor memory device of the first known example, the sidewalls of the word lines can be covered with the sidewall insulating films of an arbitrary thickness. In addition, spaces between all adjacent pairs of the word lines can be completely filled with insulating films by adjusting the thickness of the oxide film deposited by CVD to cover the sidewalls of the word lines.

By the way, in recent years, with an increase in the integration level and processing speed of nonvolatile semiconductor memory devices, processes suitable for microprocessing, such as ion implantation or plasma-assisted dry etching, have come to be frequently used for fabrication methods for a nonvolatile semiconductor memory device. However, in these processes, charging is caused, for example, during the processing of gate electrodes.

In the fabrication method for a nonvolatile semiconductor memory device of the first known example, processes with a high possibility of charging are the ion implantation 111 shown in FIG. 17B and anisotropic etching in the formation of the first sidewall insulating films 113a by the deposition of the oxide film 113 shown in FIG. 17C and the repetition of the anisotropic etching shown in FIG. 18A.

The above-mentioned processes having a high possibility of causing charging cause the storage of excessive charges in the tunnel oxide film 103a and the capacitive insulating film 105a or damage to the tunnel oxide film 103a and the capacitive insulating film 105a. This leads to problems about the lifetime and reliability of nonvolatile semiconductor memory devices.

To cope with this, there has been suggested a method for fabricating a nonvolatile semiconductor memory device according to a second known example (see, for example, Patent Document 2 (Japanese Unexamined Patent Publication No. 11-54730)).

The fabrication method for a nonvolatile semiconductor memory device of the second known example includes the steps of: forming, around a memory array, an active region for dissipating, into a semiconductor substrate, charges to be injected into control gates corresponding to the word lines and a gate insulating film or a floating gate corresponding to the capacitive insulating film during a process for processing the control gates and the gate insulating film or the floating gate; processing the word lines and the floating gate with the control gates corresponding to the word lines connected to the active region; and disconnecting the control gates from the active region.

SUMMARY OF THE INVENTION

However, in the second known example, unlike the first known example, a description is not given of control over the thicknesses of the sidewall insulating films formed on the sidewalls of the word lines, and problems about shorting between the word lines and the source diffusion layer or the drain diffusion layer or between the semiconductor substrate and the source diffusion layer or the drain diffusion layer are not recognized.

To cope with these problems, we applied the method for suppressing charging according to the second known example to the method for preventing shorting between the word lines and the source diffusion layer or the drain diffusion layer or between the semiconductor substrate and the source diffusion layer or the drain diffusion layer according to the first known example. Thus, we found that a new problem arose.

The problem arising when the method of the second known example is applied to the method of the first known example will be described hereinafter with reference to FIGS. 20A through 22C. FIGS. 20A, 21A and 22A are plan views showing a nonvolatile semiconductor memory device. FIGS. 20B, 21B and 22B are cross-sectional views partly showing the nonvolatile semiconductor memory device taken along the lines X—X shown in FIGS. 20A, 21A and 22A, respectively. FIGS. 20C, 21C and 22C are cross-sectional views partly showing the nonvolatile semiconductor memory device taken along the lines Y—Y shown in FIGS. 20A, 21A and 22A, respectively, and show the configurations of one of the end parts of one of word lines of the nonvolatile semiconductor memory device.

When the process steps of the first known example shown in FIG. 17B through 18A are carried out while a polysilicon film 204 that will become control gates corresponding to word lines is connected to an active region 200A as shown in FIGS. 20A through 20C, spaces located on parts of a capacitive insulating film 203 located between adjacent parts of the polysilicon film 204 that will become the word lines can be filled with an insulating film 205 as shown in FIGS. 21A through 21C.

Next, when parts of the polysilicon film 204 that will be control gates are disconnected by etching from part thereof on the active region 200A in the vicinity of respective one ends of the control gates corresponding to the word lines as shown in FIGS. 22A through 22C, the insulating film 205 serves as a mask. By the action of the insulating film 205, part of a polysilicon material located adjacent to the respective one ends of the control gates remains as a residual polysilicon material 204a on a region of the capacitive insulating film 203 located around the insulating film 205. Therefore, adjacent pairs of the word lines are shorted. In this case, if a period during which the polysilicon film 204 is etched to obtain the word lines is made longer, this can prevent adjacent pairs of the word lines from being shorted. However, during this period, charging is caused. This causes significant damage to the capacitive insulating film 203 or an unshown tunnel oxide film.

In view of the above, an object of the present invention is to provide a nonvolatile semiconductor memory device that can suppress damage caused by charging during processes, such as the formation of sidewall insulating films, and a method for fabricating the same.

A method for fabricating a nonvolatile semiconductor memory device according to a first aspect of the present invention includes the steps of: forming a first conductive film for forming a plurality of word lines in a memory cell array formation region of a semiconductor substrate and forming a second conductive film in a semiconductor device formation region of the semiconductor substrate; forming openings in the first conductive film by a first dry etching process using a first mask such that the word lines in the memory cell array formation region are located apart from one another; forming sidewall insulating films for the word lines in the openings formed in the first conductive film; removing parts of the sidewall insulating films located adjacent to the ends of the word lines by wet etching using a second mask; and removing a part of the first conductive film located around a word line formation region by a second dry etching process using a third mask, wherein the first and second conductive films are made of the same layer, and the step of forming openings in the first conductive film is carried out such that a part of the first conductive film remaining after the formation of the openings is continuous with the second conductive film, the second conductive film being formed on an active region of the semiconductor substrate located outside the memory cell array formation region so as to be electrically connected to the active region.

According to the method for fabricating a nonvolatile semiconductor memory device of the first aspect of the present invention, the first conductive film and the second conductive film are made of the same conductive layer, and processes causing charging, such as the formation of the sidewall insulating films, are carried out such that a part of the first conductive film remaining after the formation of the openings is continuous with the second conductive film formed on an active region of the semiconductor substrate located outside the memory cell array formation region so as to be electrically connected to the active region. Therefore, charges produced by charging can be released into the active region of the semiconductor substrate located outside the memory cell array formation region. This disperses the charges produced by charging, leading to suppression of the increase in electrical potential. This can improve the reliability of the nonvolatile semiconductor memory device.

A method for fabricating a nonvolatile semiconductor memory device according to a second aspect of the present invention includes the steps of: forming a first conductive film for forming a plurality of word lines in a memory cell array formation region of a semiconductor substrate for a nonvolatile semiconductor memory device and forming a second conductive film in a semiconductor device formation region of the semiconductor substrate; forming openings in the first conductive film by a first dry etching process using a first mask such that the word lines in the memory cell array formation region are located apart from one another; forming sidewall insulating films for the word lines in the openings formed in the first conductive film; removing parts of the sidewall insulating films located adjacent to the ends of the word lines by wet etching using a second mask; and removing a part of the first conductive film located around a word line formation region by a second dry etching process using a third mask, wherein the first and second conductive films are made of the same layer, and the step of forming openings in the first conductive film is carried out such that a part of the first conductive film remaining after the formation of the openings is continuous with the second conductive film to which the part of the first conductive film remaining after the formation of the openings is connected to a part of the semiconductor substrate located outside the memory cell array formation region through a gate insulating film forming part of a semiconductor element.

According to the method for fabricating a nonvolatile semiconductor memory device of the second aspect of the present invention, the first conductive film and the second conductive film are made of the same conductive layer, and processes causing charging, such as the formation of the sidewall insulating films, are carried out such that a part of the first conductive film remaining after the formation of the openings is continuous with the second conductive film to which the part of the first conductive film remaining after the formation of the openings is connected to a part of the semiconductor substrate located outside the memory cell array formation region through a gate insulating film forming a part of a semiconductor element. Therefore, charges produced by charging can be released into a part of the semiconductor substrate located outside the memory cell array formation region through the gate insulating film, for example, for a circuit for driving a semiconductor memory device. This suppresses damage caused by charging without forming any active region unlike the nonvolatile semiconductor memory device of the first aspect. This disperses the charges produced by charging, leading to suppression of the increase in electrical potential. This can improve the reliability of the nonvolatile semiconductor memory device.

In the method of the first or second aspect of the present invention, the part of the first conductive film remaining after the formation of the openings is preferably formed with the word lines connected to one another.

In the method of the first or second aspect of the present invention, the step of forming sidewall insulating films for the word lines preferably includes the sub-steps of: depositing an insulating film on the semiconductor substrate by CVD to entirely cover the first conductive film formed with the openings; and subjecting the deposited insulating film to anisotropic etching, and the combination of the step of depositing the insulating film and the step of subjecting the deposited insulating film to anisotropic etching is carried out at least once.

It is preferable that in the method of the first or second aspect of the present invention, the parts of the sidewall insulating films located adjacent to the ends of the word lines are formed on an isolation insulating film formed in the semiconductor substrate and the wet etching is carried out such that the isolation insulating film is at least partly left.

It is preferable that in the method of the first or second aspect of the present invention, a capacitive insulating film is formed between the semiconductor substrate and the first conductive film, the step of forming openings in the first conductive film includes the step of forming the openings while leaving the capacitive insulating film, and the step of removing parts of the sidewall insulating films located adjacent to the ends of the word lines is carried out such that the capacitive insulating film is hardly etched.

In the method of the first or second aspect of the present invention, the step of removing a part of the first conductive film located around a word line formation region preferably includes the step of removing, by wet etching, the part of the first conductive film and a predetermined part of the second conductive film simultaneously, thereby forming a gate electrode for the semiconductor device.

In the method of the first or second aspect of the present invention, the second mask and the third mask are preferably identical.

A nonvolatile semiconductor memory device according to an aspect of the present invention includes a region into which charges produced during the formation of word lines forming part of the nonvolatile semiconductor memory device are released, the region being formed in a region of a semiconductor substrate located outside a memory cell array formation region thereof for the nonvolatile semiconductor memory device.

The nonvolatile semiconductor memory device of the aspect of the present invention can have a structure that can suppress damage caused by charging during process steps until the formation of word lines forming part of the nonvolatile semiconductor memory device, such as the step of forming sidewall insulating films.

In the nonvolatile semiconductor memory device of the aspect of the present invention, the region into which charges produced during the formation of word lines are released may be a region of the semiconductor substrate on the top surface of which a gate insulating film forming part of a semiconductor device is formed, the semiconductor device being formed in the region of the semiconductor substrate located outside the memory cell array formation region. In this case, the charges produced by charging can be released into the semiconductor substrate through the gate insulating film.

In the nonvolatile semiconductor memory device of the aspect of the present invention, the region into which charges produced during the formation of word lines are released may be an active region of the semiconductor substrate located in the region of the semiconductor substrate located outside the memory cell array formation region. In this case, the charges produced by charging can be released into the active region.

DETAILED DESCRIPTION OF THE INVENTION (Embodiment 1)

A nonvolatile semiconductor memory device of a first embodiment of the present invention and a method for fabricating the same will be described hereinafter with reference to the drawings.

In the first embodiment of the present invention, for description, a nonvolatile semiconductor memory device allowing charges to be trapped in a capacitive insulating film is used as an example of nonvolatile semiconductor memory devices.

FIGS. 1A and 1B and 3A through 3C are cross-sectional views showing process steps in a method for fabricating the principal part of a nonvolatile semiconductor memory device according to the first embodiment of the present invention step by step. FIG. 2 is a plan view showing the principal part of the nonvolatile semiconductor memory device after the process step shown in FIG. 1B.

Figure 1A:
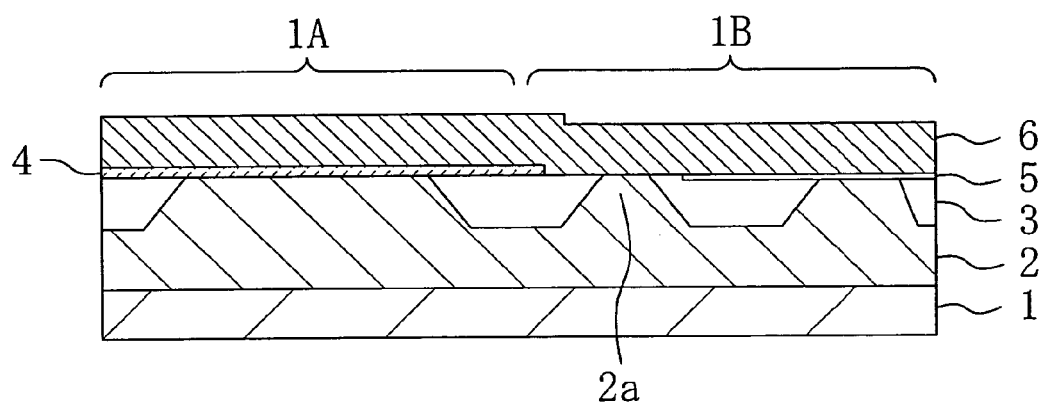
FIGS. 1A and 1B are cross-sectional views showing essential process steps in a method for fabricating a nonvolatile semiconductor memory device according to a first embodiment of the present invention.
Figure 2:
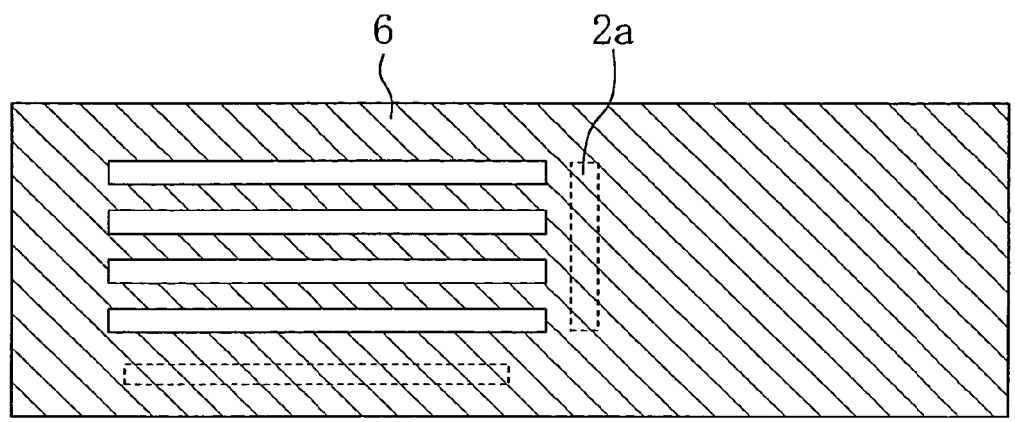
FIG. 2 is a plan view showing another essential process step in the method for fabricating a nonvolatile semiconductor memory device according to the first embodiment of the present invention.

First, as shown in FIG. 1A, a p-type well region 2 is formed in the top surface of a p-type silicon substrate 1, and an isolation insulating film 3 is formed in the p-type well region 2. Thereafter, in a first area 1A in which a memory cell array of the nonvolatile semiconductor memory device is to be formed and a second area 1B in which a semiconductor device is to be formed, a capacitive insulating film 4 is formed on an active region of the p-type silicon substrate 1. Subsequently, a part of the capacitive insulating film 4 formed in the second area 1B is removed, and then a gate oxide film 5 for the semiconductor device is formed at the top surface of a part of the p-type silicon substrate 1 located in the second area 1B. Subsequently, a part of the gate oxide film 5 located on the active region is removed, and then a polysilicon film 6 is entirely deposited on the first and second areas 1A and 1B. The capacitive insulating film 4 typically has a three-layer structure composed of an oxide film, a $Si_3N_4$ film and an oxide film (ONO film).

Figure 1B:
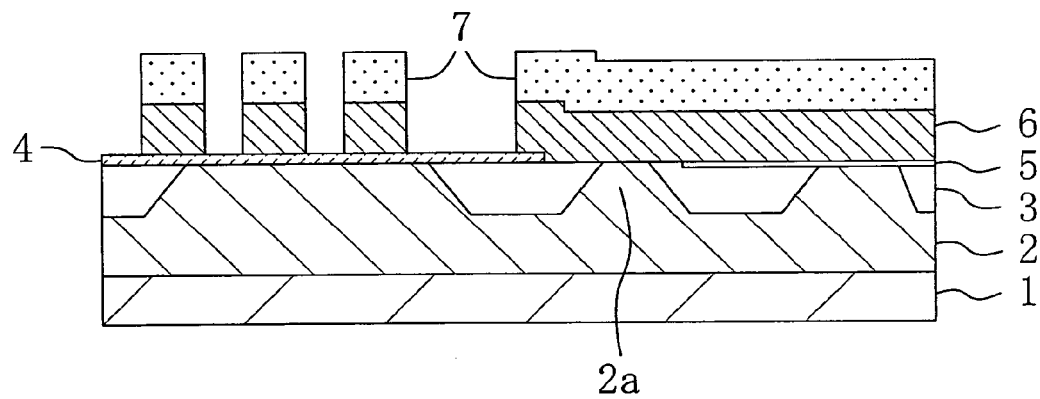

Next, as shown in FIG. 1B, a first resist pattern 7 is formed to cover parts of the first area 1A in which word lines for the memory cell array of the nonvolatile semiconductor memory device are to be formed and the second area 1B. The polysilicon film 6 is subjected to anisotropic etching using the first resist pattern 7 as a mask, thereby forming openings in a part of the polysilicon film 6 formed in the first area 1A. In this anisotropic etching, the etching selectivity of the polysilicon film 6 to the capacitive insulating film 4 is desirably set high so that the capacitive insulating film 4 is left. For example, if an ONO film is used as the capacitive insulating film 4, the etching selectivity of the polysilicon film 6 to the capacitive insulating film 4 becomes high. Therefore, the ONO film is hardly cut away unlike the polysilicon film 6. This can facilitate leaving the capacitive insulating film 4. A method for fabricating a nonvolatile semiconductor memory device will be described hereinafter using a case where the capacitive insulating film 4 is left as an example.

FIG. 2 is a plan view showing the structure of the nonvolatile semiconductor memory device when the first resist pattern 7 is removed after the process step described with reference to FIG. 1B. As shown in FIG. 2, the polysilicon film 6 formed with the openings forms a continuous region that is not disconnected between the first area 1A and the second area 1B.

Figure 3A:
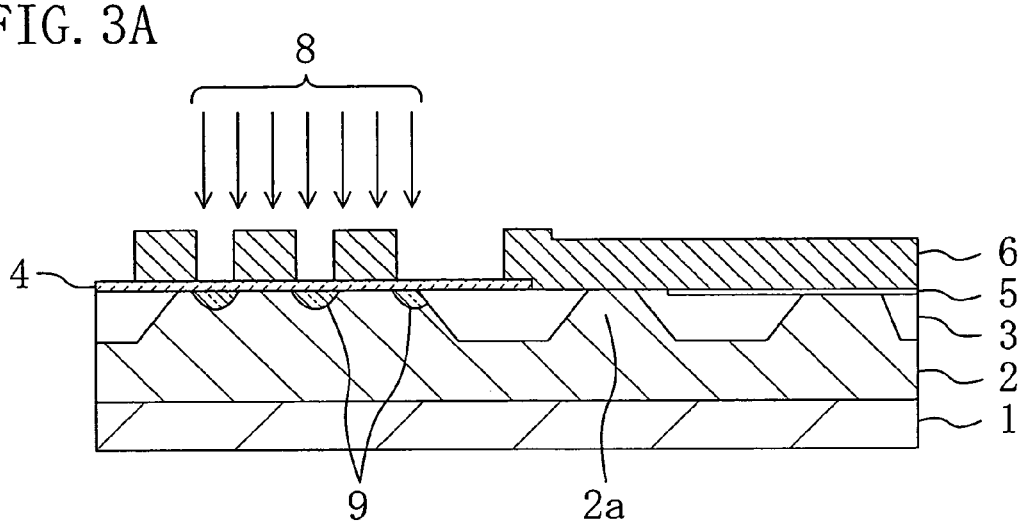
FIGS. 3A through 3C are cross-sectional views showing other essential process steps in the method for fabricating a nonvolatile semiconductor memory device according to the first embodiment of the present invention.

Next, as shown in FIG. 3A, diffusion layers 9 are formed in parts of the p-type well region 2 located in the first area 1A by ion implantation 8 using the polysilicon film 6 formed with the openings as a mask.

Figure 3B:
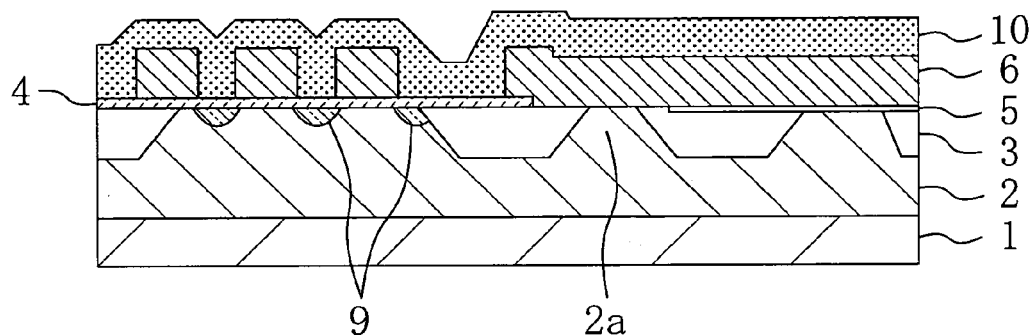

Next, as shown in FIG. 3B, an oxide film 10 is entirely formed in the first and second areas 1A and 1B by CVD to cover the polysilicon film 6 formed with the openings. Although the oxide film 10 has a thickness of, for example, about 200 nm, the thickness of the oxide film 10 can be adjusted such that sidewall insulating films that will be formed on the sidewalls of the word lines each have a desired thickness.

Figure 3C:
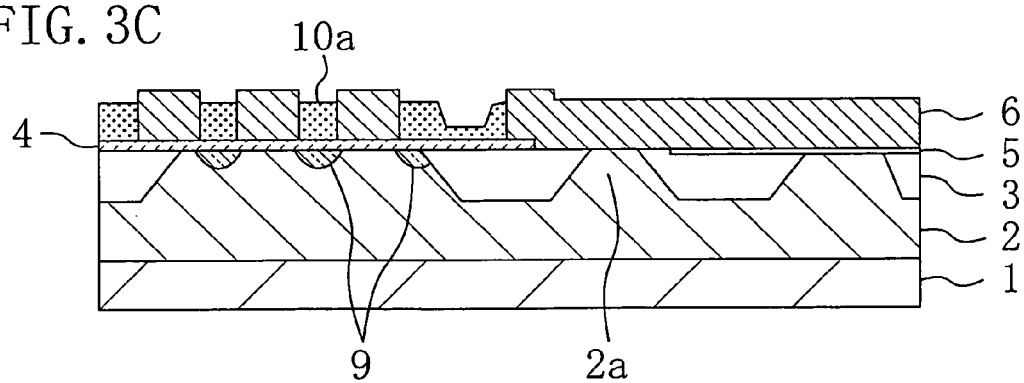

Next, as shown in FIG. 3C, the oxide film 10 is subjected to anisotropic etching to expose the top surfaces of parts of the polysilicon film 6 that are formed in the first area 1A and will become word lines and the top surface of a part of the polysilicon film 6 formed in the second area 1B. This anisotropic etching is carried out such that oxide films 10a which will be sidewall insulating films are left on the sidewalls of the parts of the polysilicon film 6 that are formed in the first area 1A and will become word lines. In this case, the anisotropic etching is carried out with such an etching selectivity that even if the oxide film 10 is completely removed by etching from above the polysilicon film 6 that is a gate electrode material, the gate electrode material or the p-type silicon substrate 1 are hardly etched. Furthermore, the thickness of the oxide films 10a left on the sidewalls of parts of the polysilicon film 6 that will become the word lines can be adjusted by adjusting the thickness of the deposited oxide film 10. In this embodiment, spaces between all adjacent pairs of parts of the polysilicon film 6 that will become the word lines are completely filled with the oxide film 10a.

Figure 4:
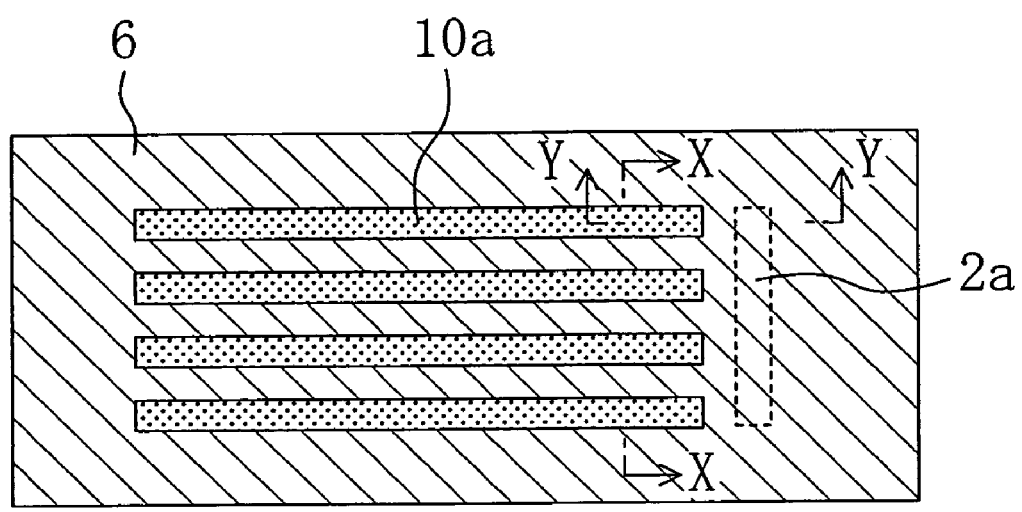
FIG. 4 is a plan view showing another essential process step in the method for fabricating a nonvolatile semiconductor memory device according to the first embodiment of the present invention.
Figure 5A:
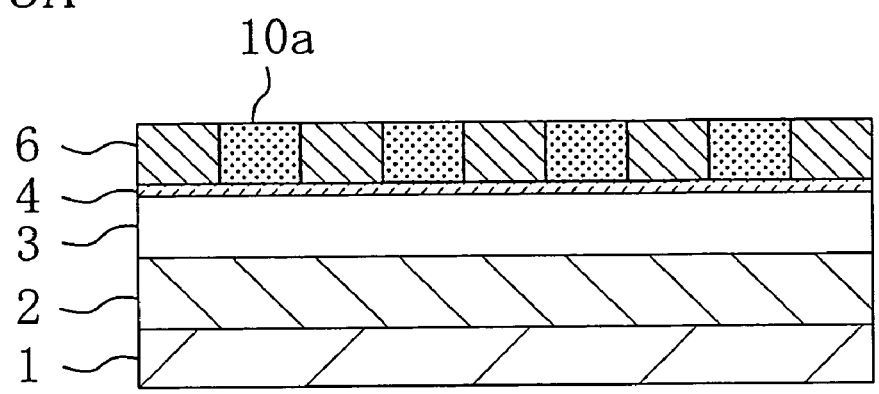
FIGS. 5A and 5B are cross-sectional views showing the another essential process step in the method for fabricating a nonvolatile semiconductor memory device according to the first embodiment of the present invention.
Figure 5B:
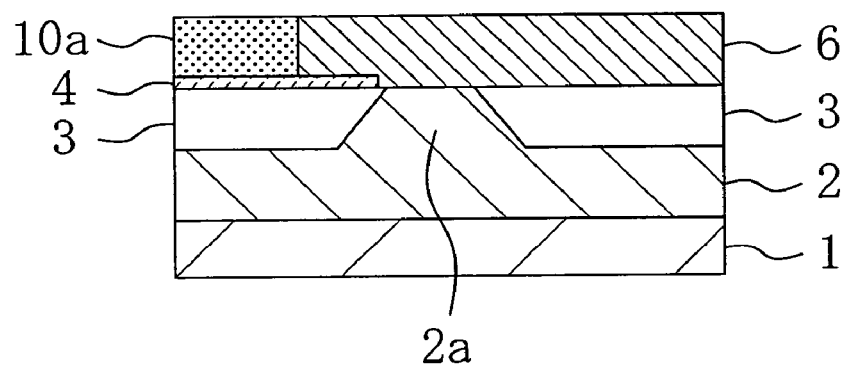

FIG. 4 is a plan view partly showing the nonvolatile semiconductor memory device after the process step shown in FIG. 3C. FIGS. 5A and 5B are cross-sectional views partly showing the nonvolatile semiconductor memory device taken along the line X—X and the line Y—Y, respectively. As shown in FIGS. 4, 5A and 5B, the oxide films 10a are formed between adjacent pairs of the parts of the polysilicon film 6 that will become the word lines as described above. Furthermore, the polysilicon film 6 forms a continuous region that is not disconnected between the first and second areas 1A and 1B.

Figure 6:
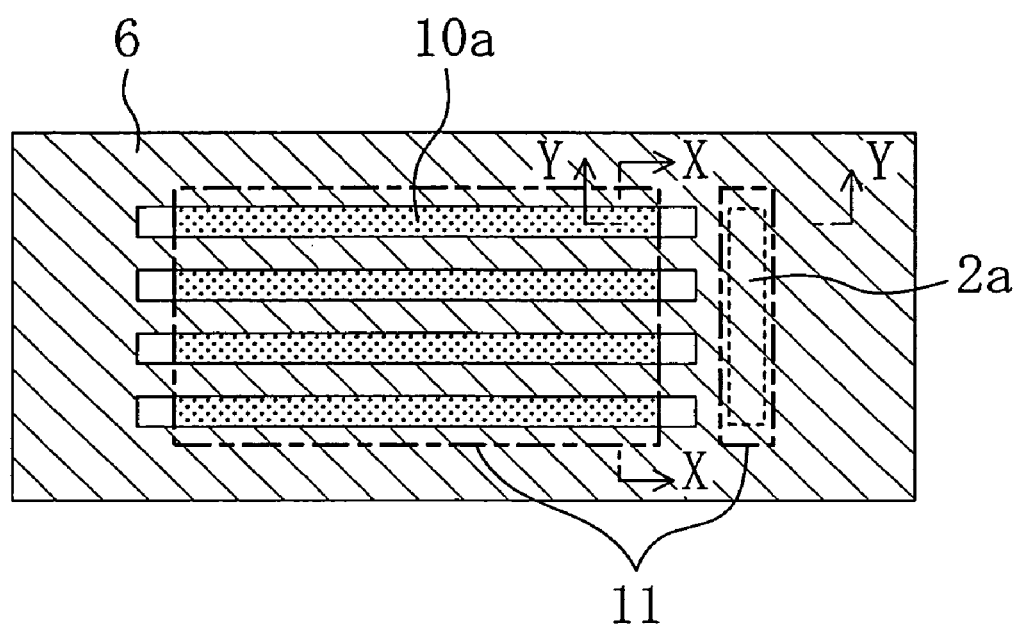
FIG. 6 is a plan view showing yet another essential process step in the method for fabricating a nonvolatile semiconductor memory device according to the first embodiment of the present invention.
Figure 7A:
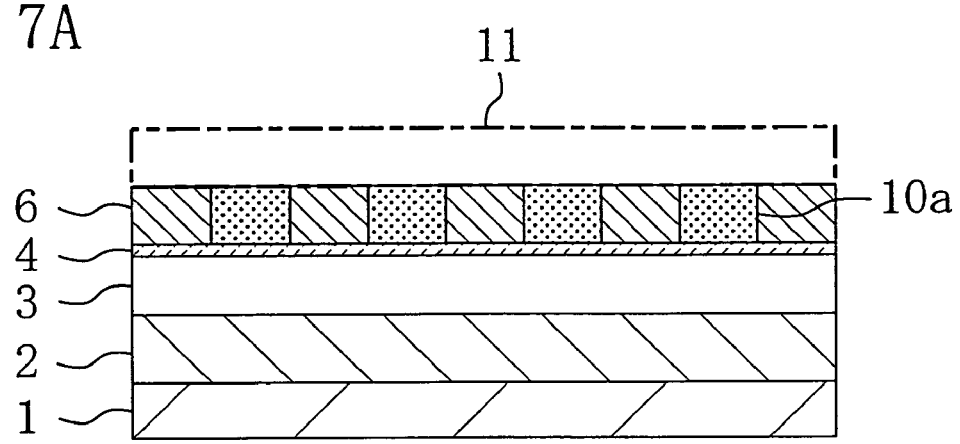
FIGS. 7A and 7B are cross-sectional views showing the yet another essential process step in the method for fabricating the principal part of a nonvolatile semiconductor memory device according to the first embodiment of the present invention.
Figure 7B:
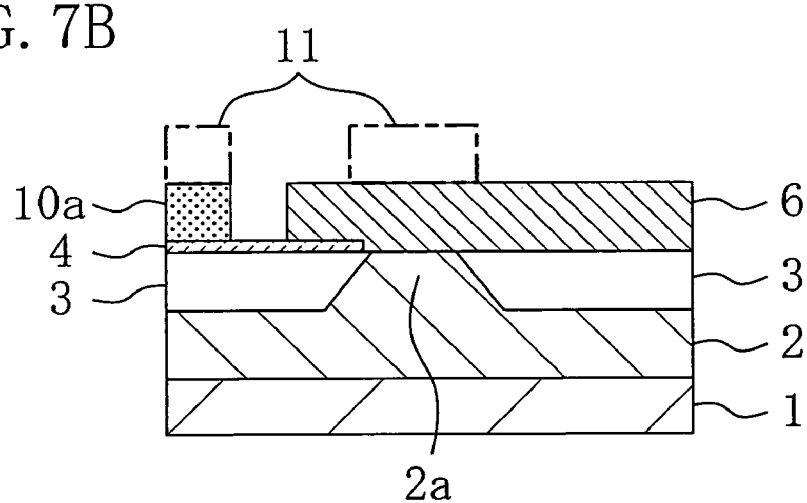

Next, as shown in FIGS. 6, 7A and 7B, a second resist pattern 11 is formed to cover parts of the polysilicon film 6 that will become the word lines and an active region 2a, and the oxide films 10a are subjected to wet etching using the second resist pattern 11 as a mask. In this way, parts of the oxide film 10a formed adjacent to the ends of the word lines are removed. In this wet etching, an etching selectivity of the polysilicon film 6 to the oxide film 10a is desirably made high. This can prevent the capacitive insulating film 4 and part of the isolation insulating film 3 formed below the capacitive insulating film 4 from being removed by etching. For example, when an ONO film is used as the capacitive insulating film 4 and a hydrofluoric acid solution is used as an etchant, a $Si_3N_4$ film forming a part of the ONO film is not cut away. This prevents the part of the isolation insulating film 3 formed below the capacitive insulating film 4 from being cut away.

Figure 8:
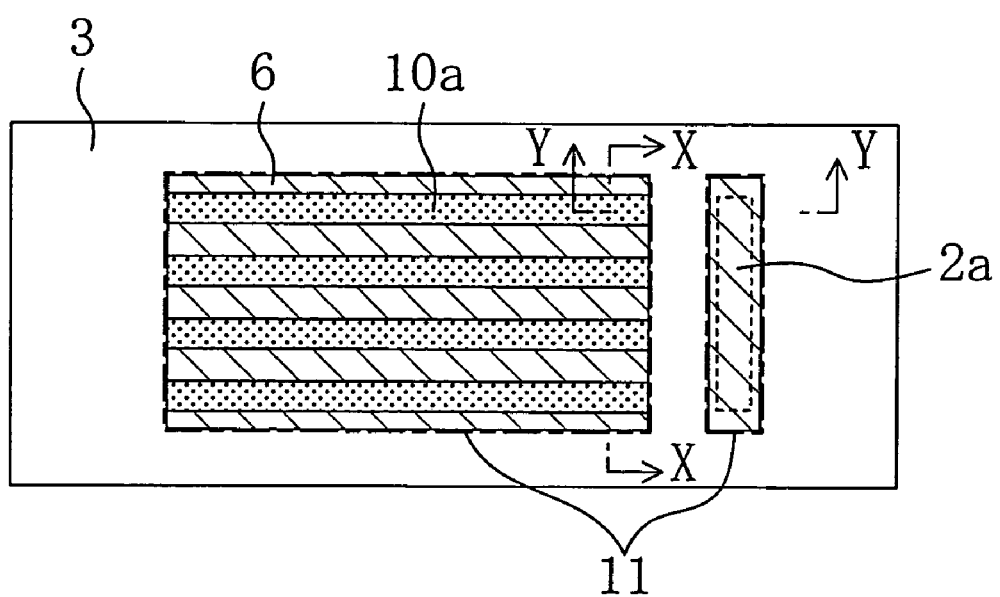
FIG. 8 is a plan view showing still another essential process step in the method for fabricating a nonvolatile semiconductor memory device according to the first embodiment of the present invention.
Figure 9A:
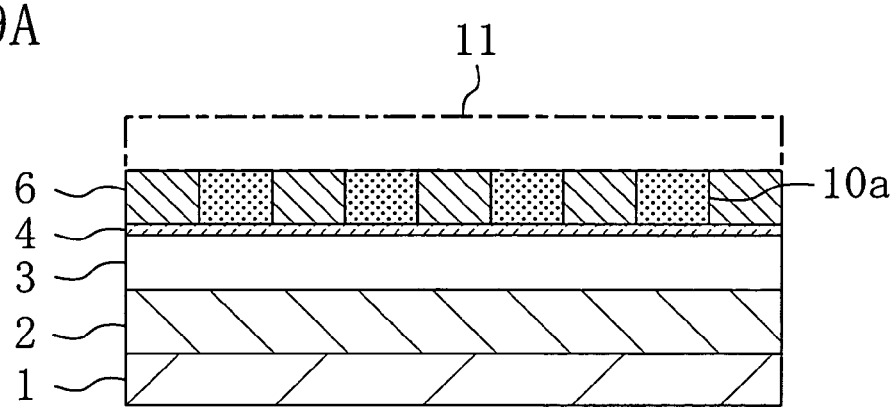
FIGS. 9A and 9B are cross-sectional views showing the still another essential process step in the method for fabricating a nonvolatile semiconductor memory device according to the first embodiment of the present invention.
Figure 9B:
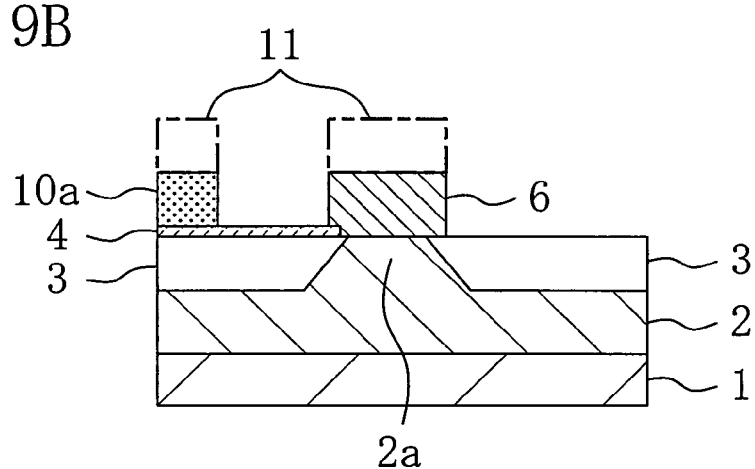

Next, as shown in FIGS. 8, 9A and 9B, part of the polysilicon film 6 located around a region in which the word lines are to be formed (hereinafter, referred to as "word line formation region") and part thereof around the active region 2a are removed by dry etching using the second resist pattern 11 as a mask. Thus, parts of the polysilicon film 6 that will become word lines are separated from one another, and parts of the polysilicon film 6 that will become the word lines are separated from parts thereof on the active region 2a. In this way, the word lines are formed so as to be located apart from one another in the first area 1A, and a gate electrode forming a part of a semiconductor device is formed in the second area 1B.

Although later process steps are not shown, ion implantation for a lightly-doped drain (LDD) of the semiconductor device, the formation of source/drain diffusion layers or other process steps are carried out and then a silicide layer is selectively formed in the top surfaces of the word lines or the gate electrode material or the top surfaces of the source/drain diffusion layers by the salicide technology as described in the known example. Thereafter, an interlayer insulating film, contact holes, an aluminum interconnect, or other elements are formed.

As described above, in the method for fabricating a nonvolatile semiconductor memory device of the first embodiment of the present invention, the ion implantation 8 shown in FIG. 3A and the process steps shown in FIGS. 3B and 3C, i.e., from the deposition of the oxide film 10 to the formation of the oxide films 10a that will become sidewall insulating films for the word lines by anisotropic etching, are carried out with the polysilicon film 6 kept continuous between the first and second areas 1A and 1B. In this way, charges produced by charging during the ion implantation 8 or the anisotropic etching can be released from parts of the polysilicon film 6 that will become the word lines through the active region 2a into the p-type silicon substrate 1. This disperses the charges produced by charging, leading to suppression of the increase in electrical potential. This can improve the reliability of the nonvolatile semiconductor memory device.

Furthermore, since parts of the oxide films 10a located adjacent to the ends of regions of the polysilicon film 6 that will become the word lines are previously removed by wet etching, this can prevent the polysilicon film 6 from partly remaining adjacent to the ends of regions thereof that will become the word lines after it is etched. This can prevent a short circuit from being caused between any adjacent pair of the word lines.

In the above description, the second resist pattern 11 is used in both cases where parts of the oxide films 10a adjacent to the ends of regions of the polysilicon film 6 that will become the word lines are removed and where a part of the polysilicon film 6 located around the word line formation region is removed to form a gate electrode for the semiconductor device in the second area 1B. The use of the same resist pattern as described above can eliminate a single resist pattern formation step unlike the use of different resist patterns. However, when a gate electrode for the semiconductor device is formed in the second area 1B, this requires high-accuracy etching. Therefore, when the part of the polysilicon film 6 formed around the word line formation region is removed by wet etching, an exclusive resist pattern is used for wet etching. In addition, when the gate electrode is formed in the second area 1B, not the second resist pattern 11 but another resist pattern may be used.

In the first embodiment of the present invention, a description was given of the case where the active region 2a is formed. However, since the gate oxide film 5 for the semiconductor device in the second area 1B is usually thinner than the capacitive insulating film 4, the charges produced by charging can be released through the gate oxide film 5 into the p-type silicon substrate 1 to some extent. Therefore, even when in the first embodiment of the present invention the active region 2a is not formed, the first embodiment of the present invention can be achieved. In this case, the step of forming the active region 2a can be eliminated.

(Embodiment 2)

A nonvolatile semiconductor memory device according to a second embodiment of the present invention and a method for fabricating the same will be described hereinafter with reference to the drawings.

In the second embodiment of the present invention, for description, a stacked nonvolatile semiconductor memory device having a floating gate is used as an example of nonvolatile semiconductor memory devices.

Figure 18A:
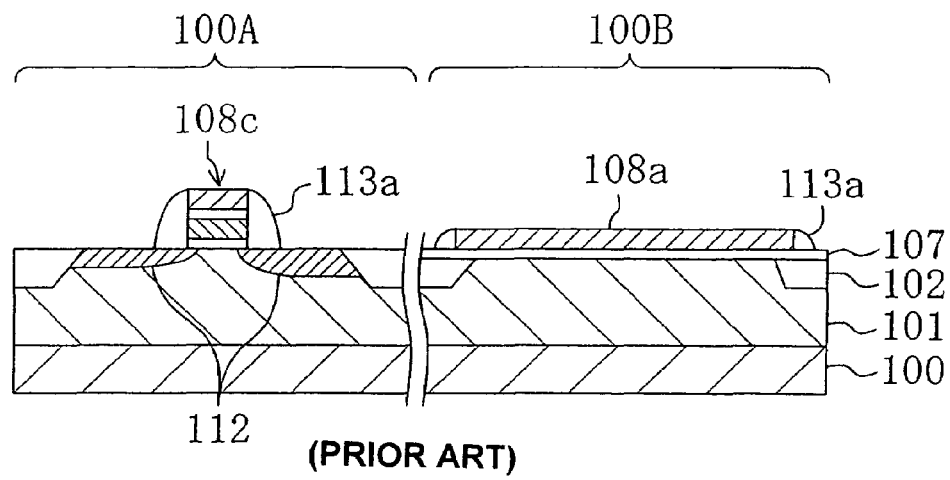
FIGS. 18A through 18C are cross-sectional views showing some of the essential process steps in the method for fabricating a nonvolatile semiconductor memory device according to the first example.
Figure 18B:
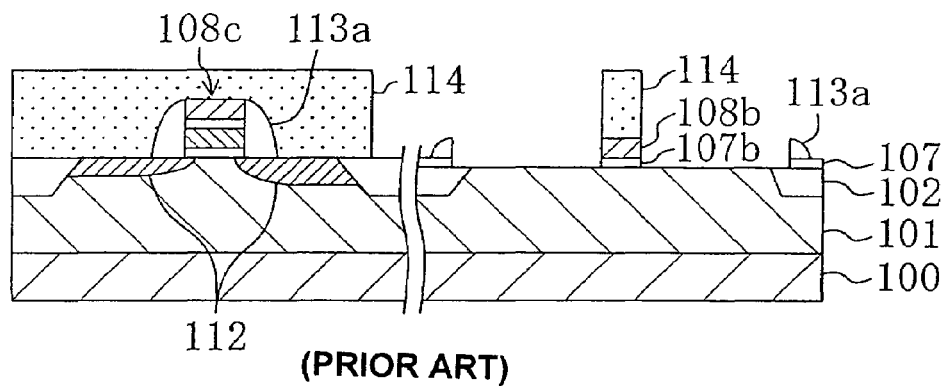
Figure 18C:
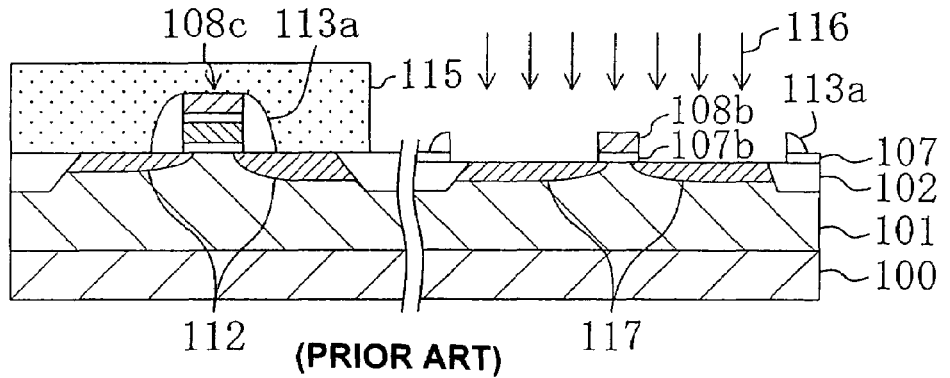
Figure 19:
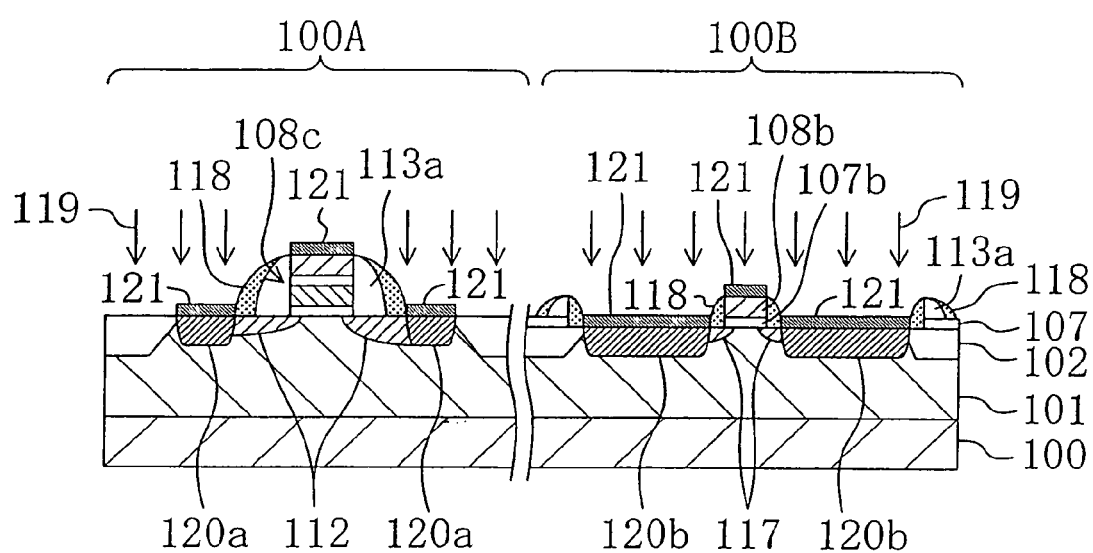
FIG. 19 is a cross-sectional view showing one of the essential process steps in the method for fabricating a nonvolatile semiconductor memory device according to the first known example.
Figure 20A:
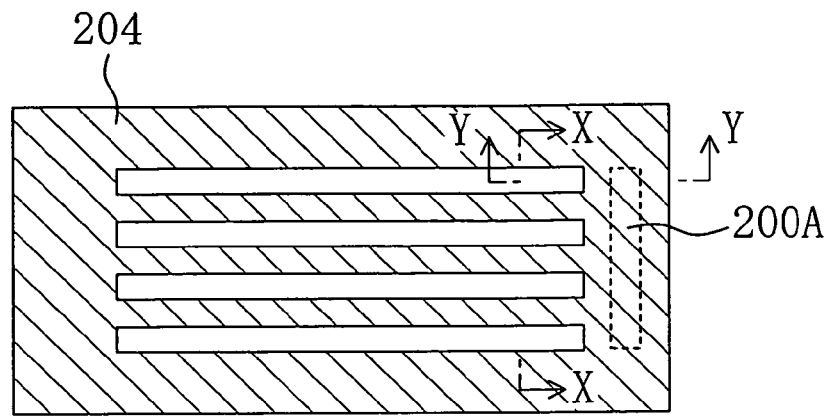
FIG. 20A is a plan view showing an essential process step in a method for fabricating a nonvolatile semiconductor memory device for the purpose of explaining a problem to be solved by the present invention.
Figure 20B:
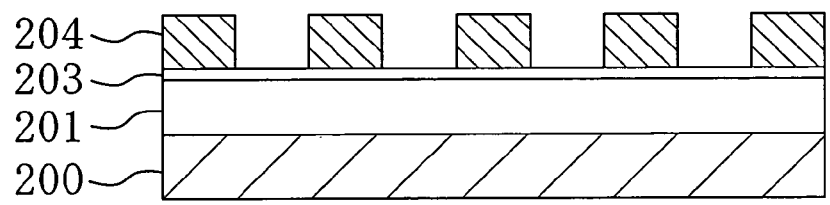
FIGS. 20B and 20C are cross-sectional views showing the process step in the method for fabricating a nonvolatile semiconductor memory device for the purpose of explaining the problem to be solved by the present invention.
Figure 20C:
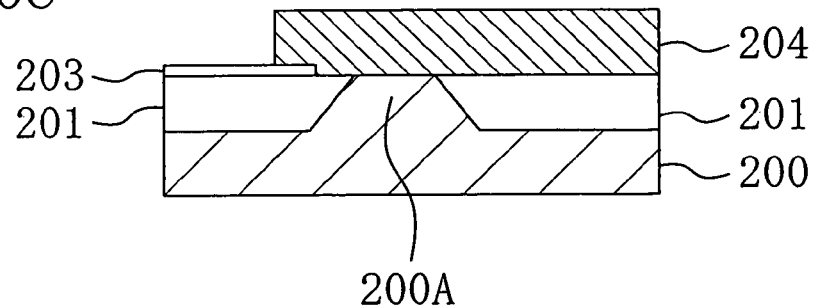
Figure 21A:
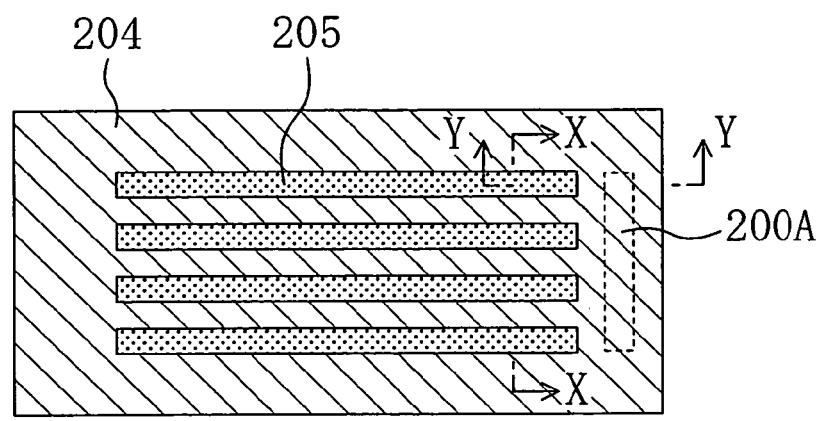
FIG. 21A is a plan view showing another essential process step in the method for fabricating a nonvolatile semiconductor memory device for the purpose of explaining the problem to be solved by the present invention.
Figure 21B:
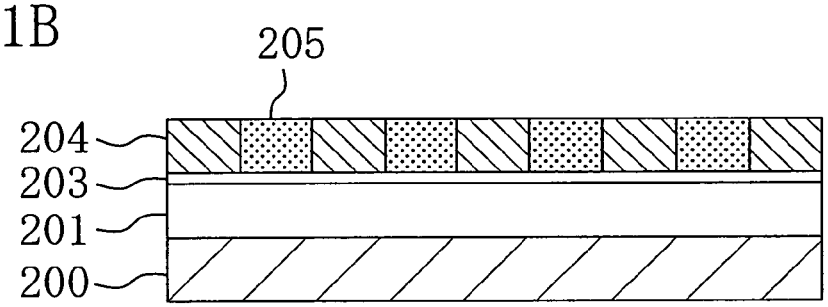
FIGS. 21B and 21C are cross-sectional views showing the another process step in the method for fabricating a nonvolatile semiconductor memory device for the purpose of explaining the problem to be solved by the present invention.
Figure 21C:
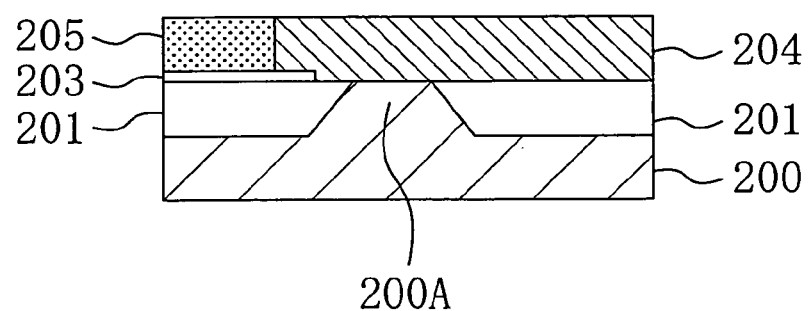
Figure 22A:
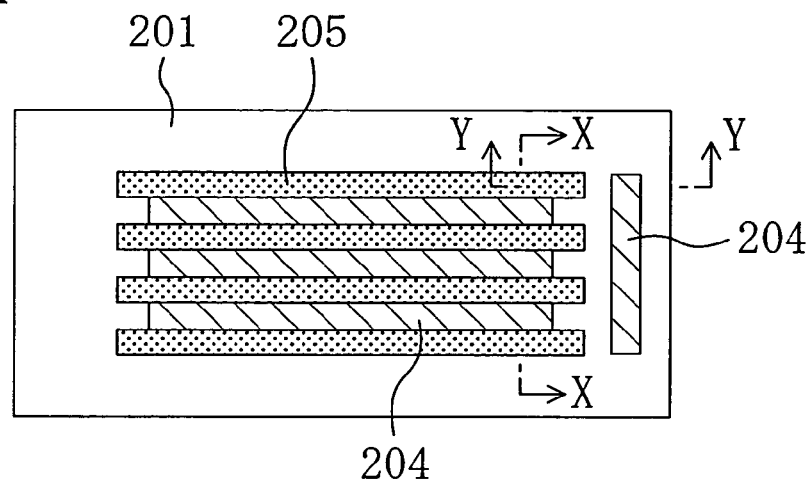
FIG. 22A is a plan view showing yet another essential process step in the method for fabricating a nonvolatile semiconductor memory device for the purpose of explaining the problem to be solved by the present invention.
Figure 22B:
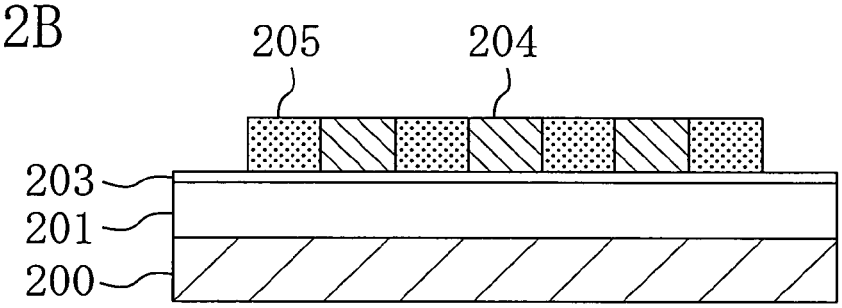
FIGS. 22B and 22C are cross-sectional views showing the yet another process step in the method for fabricating a nonvolatile semiconductor memory device for the purpose of explaining the problem to be solved by the present invention.
Figure 22C:
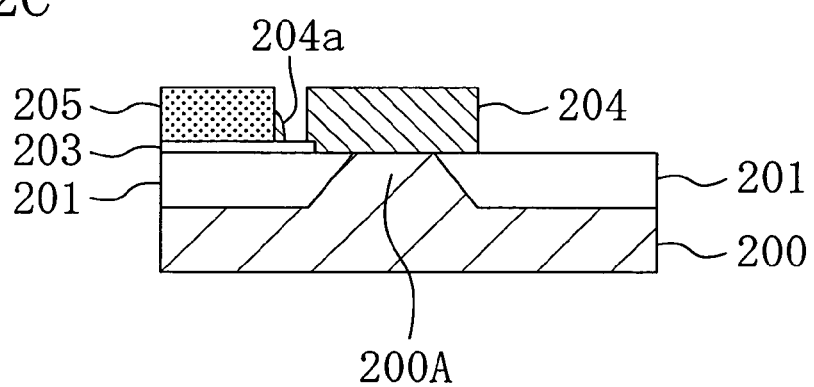

First, the process steps successively described with reference to FIGS. 16A through 17C and 18A in the known example are carried out likewise, and thus the state of the nonvolatile semiconductor memory device shown in FIG. 18A is obtained. A detailed description and drawings corresponding to these process steps are similar to those in the known example. Thus, the same description will not be repeated. In this embodiment, in the process step shown in FIG. 17A, a second polysilicon film 108a is processed to form a continuous region that is not disconnected between first and second areas 1A and 1B like the process step shown in FIG. 1B of the first embodiment. In the resultant state of the nonvolatile semiconductor memory device, later process steps shown in FIGS. 17B through 18A are carried out. Although not shown in FIGS. 16C through 18A, a part of a gate oxide film 107 located on an active region 250A that will be described below is removed.

In the above-mentioned process steps, the fabrication method for a nonvolatile semiconductor memory device according to the second embodiment of the present invention has the following problem. Unlike the fabrication method for a nonvolatile semiconductor memory device of the first embodiment, in the process step shown in FIG. 17A, when a stacked gate electrode 108c is formed by etching, a tunnel oxide film 103 of the second embodiment corresponding to the capacitive insulating film 4 that is not etched in the first embodiment must also be etched. More particularly, in the first embodiment, the capacitive insulating film 4 is formed below the polysilicon film 6 in the first area 1A and therefore left below parts of the polysilicon film 6 adjacent to the ends of regions thereof that will become word lines as shown in FIG. 1B. On the other hand, in the second embodiment of the present invention, after the process step shown in FIG. 17A, the tunnel oxide film 103 cannot be left below parts of a first polysilicon film 104 adjacent to the ends of regions thereof that will become the word lines.

Figure 10:
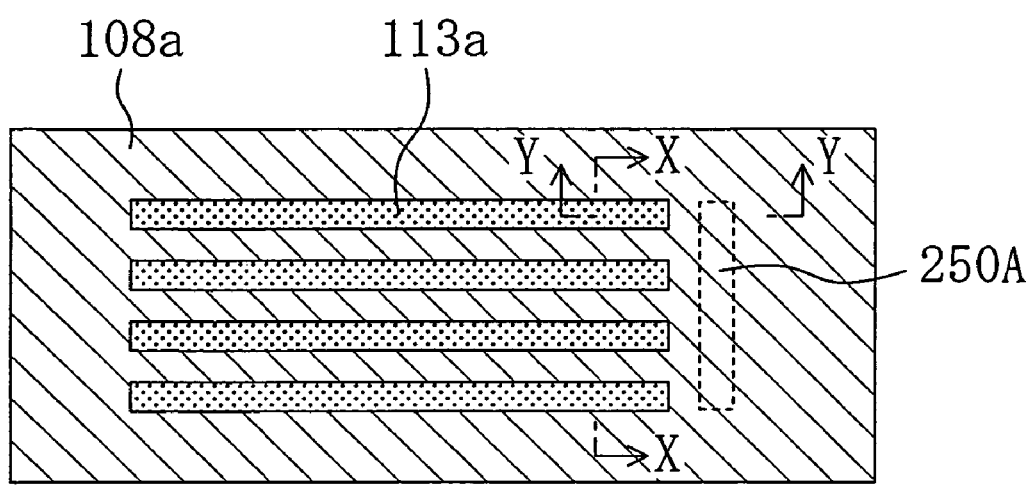
FIG. 10 is a plan view showing an essential process step in a method for fabricating a nonvolatile semiconductor memory device according to a second embodiment of the present invention.
Figure 11A:
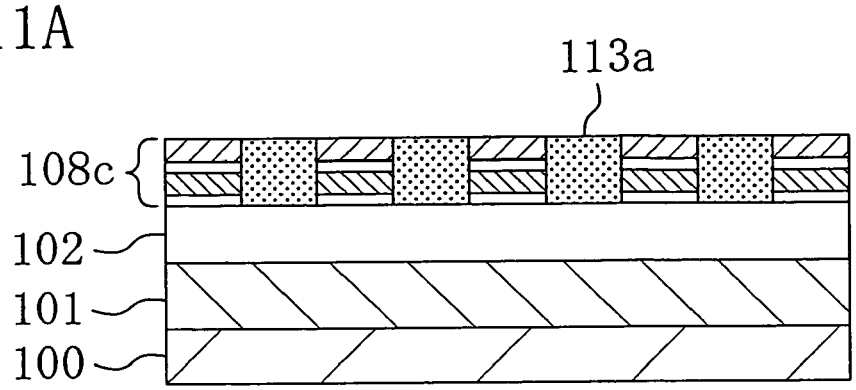
FIGS. 11A and 11B are cross-sectional views showing the essential process step in the method for fabricating a nonvolatile semiconductor memory device according to the second embodiment of the present invention.
Figure 11B:
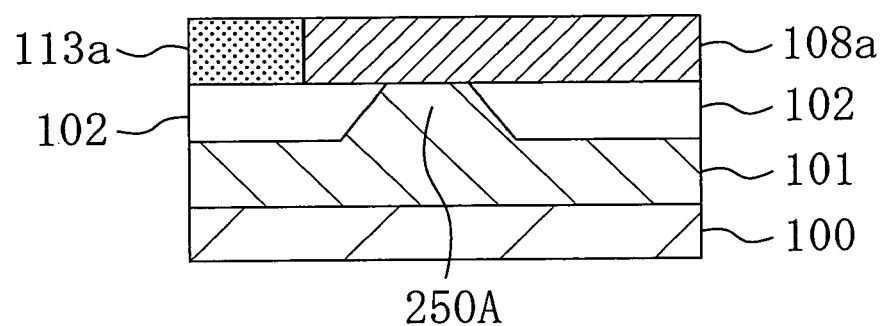

FIG. 10 is a plan view showing the principal part of the nonvolatile semiconductor memory device after the process step shown in FIG. 18A, and FIGS. 11A and 11B are cross-sectional views showing the principal part of the nonvolatile semiconductor memory device taken along the line X—X and the line Y—Y, respectively. As shown in FIGS. 10, 11A and 11B, the tunnel oxide film 103 is not formed below parts of a second polysilicon film 108a adjacent to the ends of regions thereof that will become the word lines. First sidewall insulating films 113a are formed between all adjacent pairs of parts of the second polysilicon film 108a that will become the word lines, and the second polysilicon film 108a forms a continuous region that is not disconnected between the first and second areas 1A and 1B.

Figure 12:
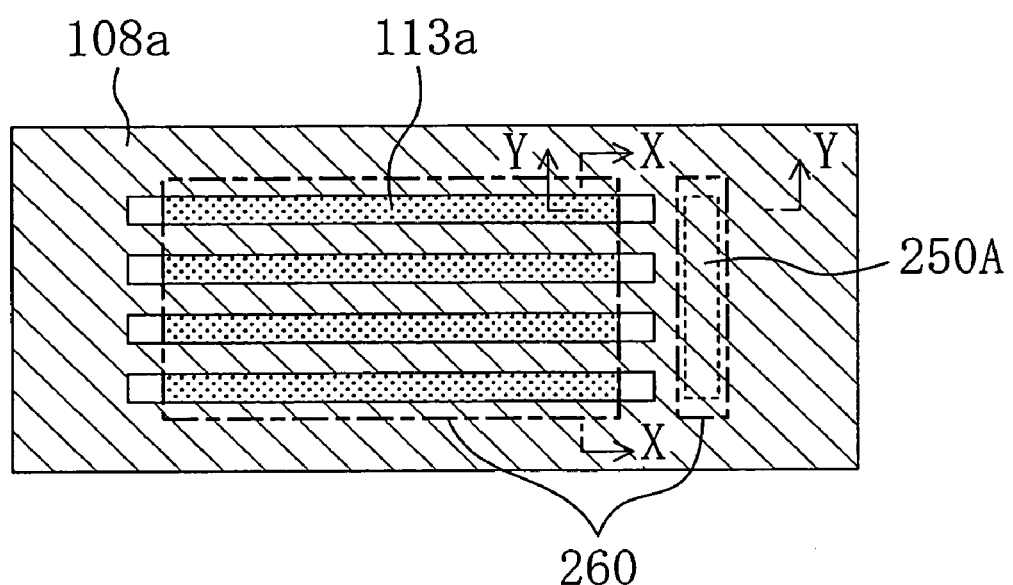
FIG. 12 is a plan view showing another essential process step in the method for fabricating a nonvolatile semiconductor memory device according to the second embodiment of the present invention.
Figure 13A:
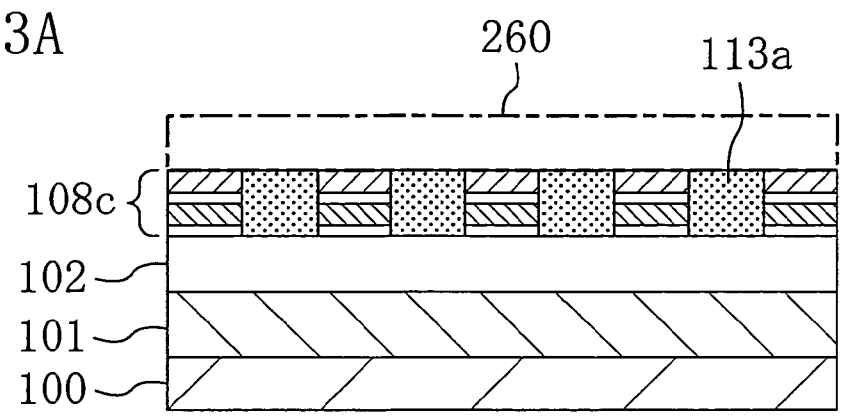
FIGS. 13A and 13B are cross-sectional views showing the another essential process step in the method for fabricating a nonvolatile semiconductor memory device according to the second embodiment of the present invention.
Figure 13B:
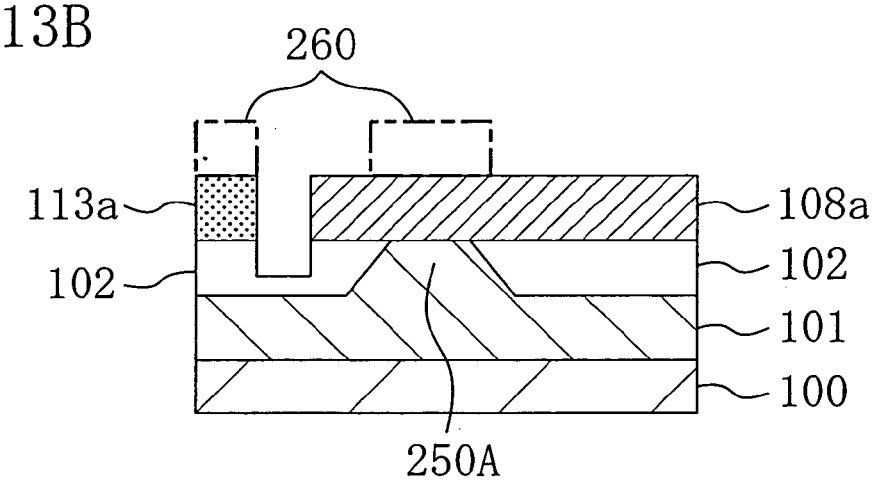

Next, as shown in FIGS. 12, 13A and 13B, a first resist pattern 260 is formed to cover the word line formation region and the active region 250A, and wet etching is performed using the first resist pattern 260 as a mask. In this way, respective parts of the first sidewall insulating films 113a formed adjacent to the ends of regions of the second polysilicon film 108a that will become the word lines are removed. In this case, since the tunnel oxide film 103 is not formed below parts of the second polysilicon film 108a adjacent to the ends of regions thereof that will become the word lines, the isolation insulating film 102 is removed to some extent. Wet etching in this embodiment is desirably carried out under the condition that the isolation insulating film 102 is at least partly left without being completely removed.

Figure 14:
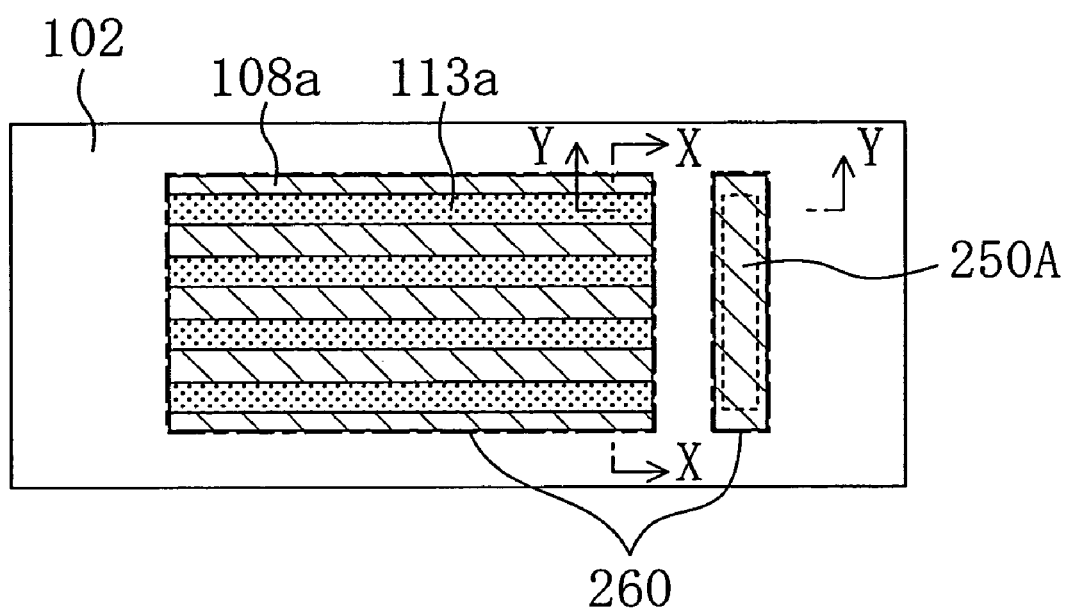
FIG. 14 is a plan view showing yet another essential process step in the method for fabricating a nonvolatile semiconductor memory device according to the second embodiment of the present invention.
Figure 15A:
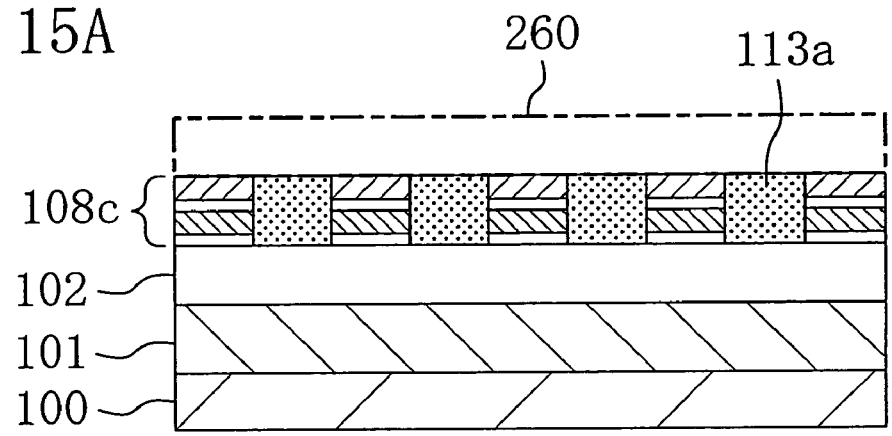
FIGS. 15A and 15B are cross-sectional views showing the yet another essential process step in the method for fabricating a nonvolatile semiconductor memory device according to the second embodiment of the present invention.
Figure 15B:
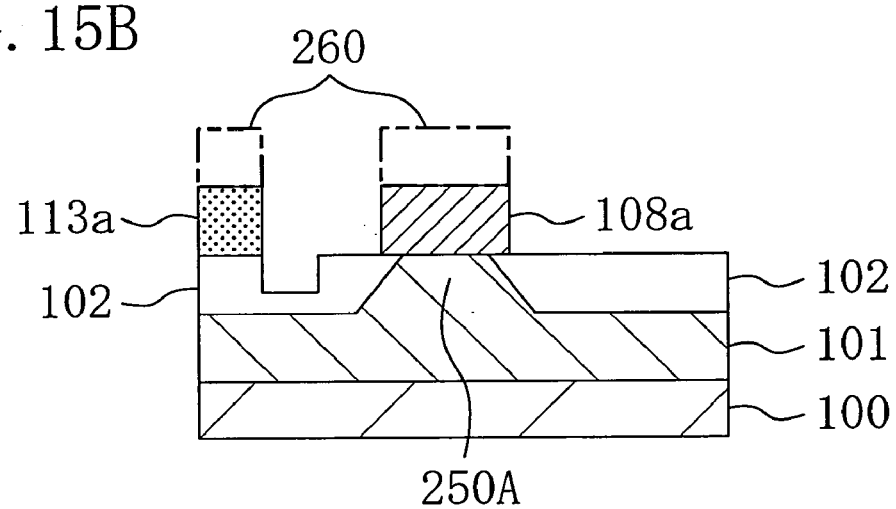
Figure 16A:
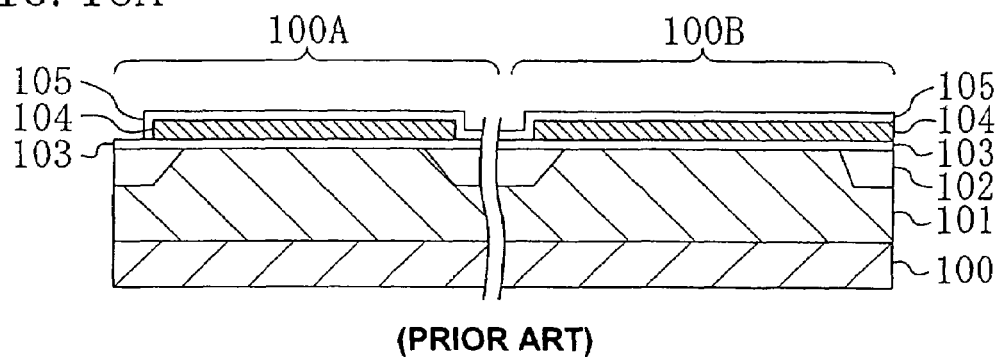
FIGS. 16A through 16C are cross-sectional views showing some of essential process steps in a method for fabricating a nonvolatile semiconductor memory device according to a first known example.
Figure 16B:
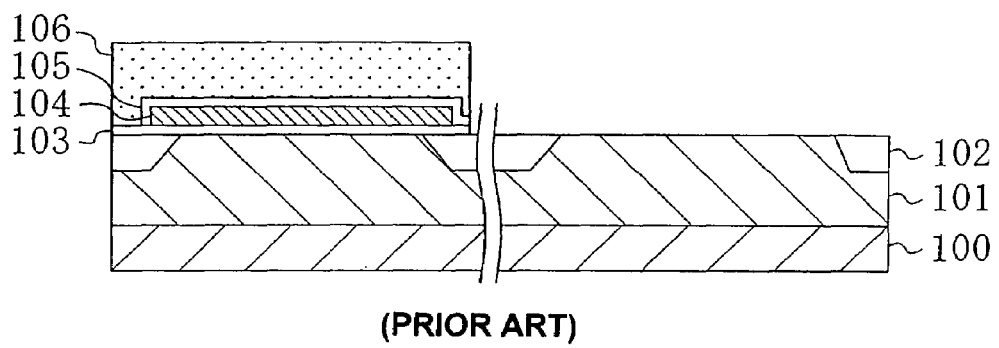
Figure 16C:
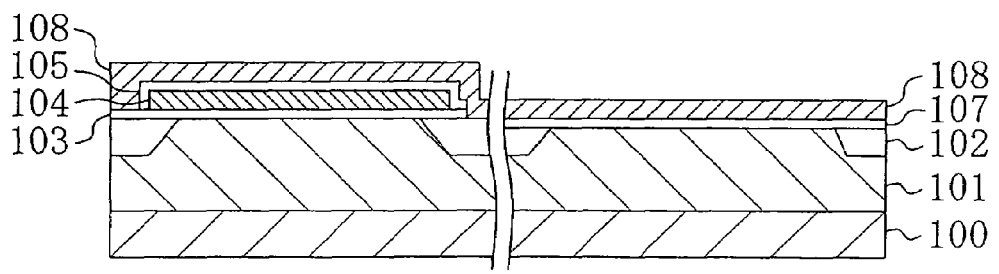
Figure 17A:
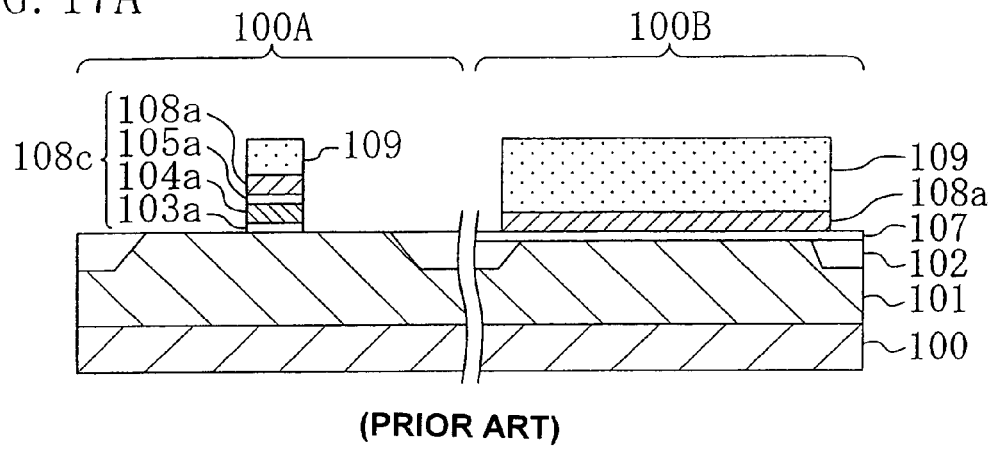
FIGS. 17A through 17C are cross-sectional views showing some of the essential process steps in the method for fabricating a nonvolatile semiconductor memory device according to the first known example.
Figure 17B:
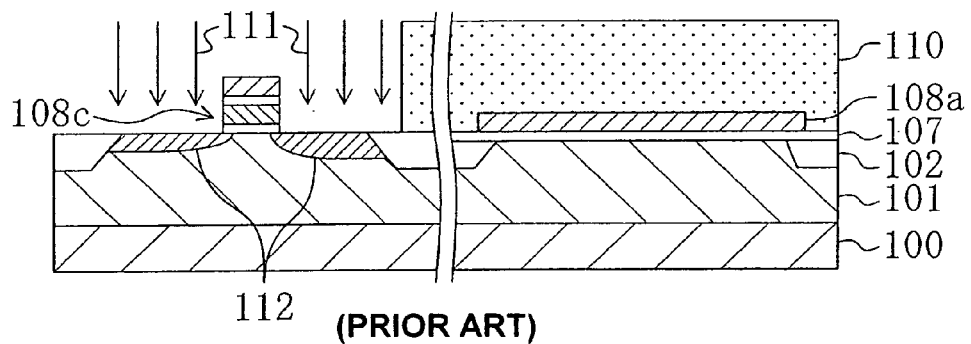
Figure 17C:
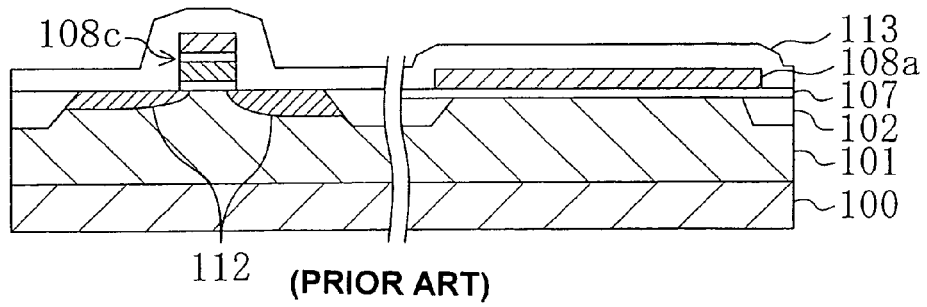

Next, as shown in FIGS. 14, 15A and 15B, part of the second polysilicon film 108a formed around the word line formation region and part thereof around the active region 250A is removed by dry etching using the first resist pattern 260 as a mask. In this way, parts of the second polysilicon film 108a that will become the word lines are separated from one another, and parts of the second polysilicon film 108a that will become the word lines are separated from part thereof on the active region 205A.

As described above, according to the nonvolatile semiconductor memory device of the second embodiment of the present invention and the method for fabricating the same, the following effects can be obtained. First, even when unlike the capacitive insulating film 4 of the first embodiment it is difficult to leave the tunnel oxide film 103 below the parts of the second polysilicon film 108a adjacent to the ends of regions thereof that will become the word lines, charges produced by charging during the ion implantation or the anisotropic etching in the process steps shown in FIGS. 17B through 18A can be released, like the first embodiment, from the word lines through the active region 250A into the p-type silicon substrate 100 by optimizing the wet etching conditions such that the isolation insulating film 102 is not cut away too much. This disperses the charges produced by charging, leading to suppression of the increase in electrical potential. This can improve the reliability of the nonvolatile semiconductor memory device.

Furthermore, since respective parts of the first sidewall insulating films 113a located adjacent to the ends of the second polysilicon film 108a that will become the word lines are previously removed by wet etching, this can prevent the second polysilicon film 108a from partly remaining adjacent to the ends of regions thereof that will become the word lines after it is etched. This can prevent a short circuit from being caused between any adjacent pair of the word lines.

Furthermore, like the first embodiment, in the process steps shown in FIGS. 14, 15A and 15B, the first resist pattern 260 used in the process steps shown in FIGS. 12, 13A and 13B is used again. However, not the first resist pattern 260 but another resist pattern may be used.

As described above, according to the nonvolatile semiconductor memory device of the present invention and the method for fabricating the same, sidewall insulating films for word lines can be formed to have a desired thickness while damage to a capacitive insulating film, resulting from charging during a semiconductor process, is reduced and suppressed. Therefore, the nonvolatile semiconductor memory device of the present invention and the method for fabricating the same are useful, in particular, as a nonvolatile semiconductor memory device that will be significantly affected in its characteristics by the damage caused by charging during processing and a method for fabricating the same.

What is claimed is:

1. A method for fabricating a nonvolatile semiconductor memory device, the method comprising the steps of:

forming a first conductive film for forming a plurality of word lines in a memory cell array formation region of a semiconductor substrate and forming a second conductive film in a semiconductor device formation region of the semiconductor substrate;

forming openings in the first conductive film by a first dry etching process using a first mask such that the word lines in the memory cell array formation region are located apart from one another;

forming sidewall insulating films for the word lines in the openings formed in the first conductive film;

removing parts of the sidewall insulating films located adjacent to the ends of the word lines by wet etching using a second mask; and removing a part of the first conductive film located around a word line formation region by a second dry etching process using a third mask, wherein the first and second conductive films are made of the same layer, and the step of forming openings in the first conductive film is carried out such that a part of the first conductive film remaining after the formation of the openings is continuous with the second conductive film, the second conductive film being formed on an active region of the semiconductor substrate located outside the memory cell array formation region so as to be electrically connected to the active region.

2. The method of claim 1, wherein
the part of the first conductive film remaining after the formation of the openings is formed with the word lines connected to one another.

3. The method of claim 1, wherein
the step of forming sidewall insulating films for the word lines comprises the sub-steps of:

depositing an insulating film on the semiconductor substrate by CVD to entirely cover the first conductive film formed with the openings; and subjecting the deposited insulating film to anisotropic etching, wherein the combination of the step of depositing the insulating film and the step of subjecting the deposited insulating film to anisotropic etching is carried out at least once.

4. The method of claim 1, wherein
the parts of the sidewall insulating films located adjacent to the ends of the word lines are formed on an isolation insulating film formed in the semiconductor substrate, and the wet etching is carried out such that the isolation insulating film is at least partly left.

5. The method of claim 1, wherein
a capacitive insulating film is formed between the semiconductor substrate and the first conductive film, the step of forming openings in the first conductive film comprises the step of forming the openings while leaving the capacitive insulating film, and the step of removing parts of the sidewall insulating films located adjacent to the ends of the word lines is carried out such that the capacitive insulating film is hardly etched.

6. The method of claim 1, wherein
the step of removing a part of the first conductive film located around a word line formation region comprises the step of removing, by wet etching, the part of the first conductive film and a predetermined part of the second conductive film simultaneously, thereby forming a gate electrode for the semiconductor device.

7. The method of claim 1, wherein
the second mask and the third mask are identical.

8. A method for fabricating a nonvolatile semiconductor memory device, the method comprising the steps of:

forming a first conductive film for forming a plurality of word lines in a memory cell array formation region of a semiconductor substrate for a nonvolatile semiconductor memory device and forming a second conductive film in a semiconductor device formation region of the semiconductor substrate;

forming openings in the first conductive film by a first dry etching process using a first mask such that the word lines in the memory cell array formation region are located apart from one another;

forming sidewall insulating films for the word lines in the openings formed in the first conductive film;

removing parts of the sidewall insulating films located adjacent to the ends of the word lines by wet etching using a second mask; and removing a part of the first conductive film located around a word line formation region by a second dry etching process using a third mask, wherein the first and second conductive films are made of the same layer, and the step of forming openings in the first conductive film is carried out such that a part of the first conductive film remaining after the formation of the openings is continuous with the second conductive film to which the part of the first conductive film remaining after the formation of the openings is connected to a part of the semiconductor substrate located outside the memory cell array formation region through a gate insulating film forming part of a semiconductor element.

9. The method of claim 8, wherein
the part of the first conductive film remaining after the formation of the openings is formed with the word lines connected to one another.

10. The method of claim 8, wherein
the step of forming sidewall insulating films for the word lines comprises the sub-steps of:

depositing an insulating film on the semiconductor substrate by CVD to cover the first conductive film formed with the openings; and subjecting the deposited insulating film to anisotropic etching, and the combination of the step of depositing the insulating film and the step of subjecting the deposited insulating film to anisotropic etching is carried out at least once.

11. The method of claim 8, wherein
the parts of the sidewall insulating films located adjacent to the ends of the word lines are formed on an isolation insulating film formed in the semiconductor substrate, and the wet etching is carried out such that the isolation insulating film is at least partly left.

12. The method of claim 8, wherein
a capacitive insulating film is formed between the semiconductor substrate and the first conductive film, the step of forming openings in the first conductive film comprises the step of forming the openings while leaving the capacitive insulating film, and the step of removing parts of the sidewall insulating films located adjacent to the ends of the word lines is carried out such that the capacitive insulating film is hardly etched.

13. The method of claim 8, wherein
the step of removing a part of the first conductive film located around a word line formation region comprises the step of removing, by wet etching, the part of the first conductive film and a predetermined part of the second conductive film simultaneously, thereby forming a gate electrode for the semiconductor device.

14. The method of claim 8, wherein
the second mask and the third mask are identical.

* * * * *